United States Patent
Hershman

(10) Patent No.: US 10,824,396 B2
(45) Date of Patent: Nov. 3, 2020

(54) RANDOM NUMBER GENERATOR BASED ON META-STABILITY OF SHORTED BACK-TO-BACK INVERTERS

(71) Applicant: NUVOTON TECHNOLOGY CORPORATION, Hsin-chu (TW)

(72) Inventor: Ziv Hershman, Givat Shmuel (IL)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 16/258,741

(22) Filed: Jan. 28, 2019

(65) Prior Publication Data

US 2020/0241843 A1 Jul. 30, 2020

(51) Int. Cl.
G06F 7/58 (2006.01)
H03K 3/84 (2006.01)

(52) U.S. Cl.
CPC .............. *G06F 7/588* (2013.01); *H03K 3/84* (2013.01)

(58) Field of Classification Search
CPC .............. G06F 7/588; G06F 7/58; H03K 3/84
See application file for complete search history.

(56) References Cited

U.S. PATENT DOCUMENTS

| | | | | |
|---|---|---|---|---|
| 8,489,660 B2* | 7/2013 | Herbert | .................. | G06F 7/588 380/240 |
| 9,189,202 B2* | 11/2015 | Burleson | .................. | G06F 7/588 |
| 2008/0091755 A1* | 4/2008 | Mudge | .................... | G06F 7/588 708/250 |
| 2009/0106339 A1* | 4/2009 | Vasyltsov | ................ | H03K 3/84 708/251 |
| 2013/0093502 A1* | 4/2013 | Kim | ...................... | H04L 9/3278 327/525 |
| 2015/0178048 A1* | 6/2015 | Burleson | ................ | G06F 7/588 708/255 |
| 2018/0143806 A1* | 5/2018 | Park | ........................ | G06F 7/582 |
| 2020/0042289 A1* | 2/2020 | Wang | ...................... | H03K 3/84 |

OTHER PUBLICATIONS

Hamburg et al. on "Analysis of Intel's Ivy Bridge Digital Random Number Generator", Mar. 2012. Retrieved on [Jun. 18, 2020]. Retrieved from the Internet <https://cdn.atraining.ru/docs/Intel_TRNG_Report_20120312.pdf> (Year: 2012).*

(Continued)

*Primary Examiner* — Andrew Caldwell
*Assistant Examiner* — Carlo Waje
(74) *Attorney, Agent, or Firm* — Kligler & Associates Patent Attorneys Ltd

(57) ABSTRACT

An electronic circuit for Random Number Generation (RNG) includes a first inverter having a first input and a first output, and a second inverter having a second input and a second output. The first output is connected to the second input, and the second output is connected to the first input. A switch is configured to (i) when closed, to set the first and second inverters to a meta-stable state by shorting the first output to the first input and the second output to the second input, and (ii) when open, to release the first and second inverters from the meta-stable state to a bi-stable random state. Logic circuitry is configured to alternately close and open the switch, and to output random values from at least one of the first and second inverters when at the bi-stable random state.

22 Claims, 5 Drawing Sheets

(56) References Cited

OTHER PUBLICATIONS

Tokunaga et al. on "True Random Number Generator With a Metastability-Based Quality Control", In IEEE Journal of Solid-State Circuits, vol. 43, No. 1, pp. 78-85, Jan. 2008. Retrieved on [Jun. 18, 2020]. Retrieved from the Internet <https://ieeexplore.ieee.org/document/4443211> (Year: 2008).*

Kinniment et al. on "Design of an On-Chip Random Number Generator using Metastability", In Proceedings of the 28th European Solid-State Circuits Conference, Florence, Italy, 2002, pp. 595-598. Retrieved on [Jun. 18, 2020]. Retrieved from the Internet <https://ieeexplore.ieee.org/document/1471597> (Year: 2002).*

Barangi et al., "Straintronics-Based True Random Number Generator for High-Speed and Energy-Limited Applications", IEEE Transactions on Magnetics, vol. 52, No. 1, pp. 1-9, Jan. 2016.

Hars., "Random Number Generation Based on Oscillatory Metastability in Ring Circuits", Cryptology ePrint Archive, Issue 2011/637, pp. 1-15, Nov. 26, 2011.

Hata et al., "FPGA Implementation of Metastability-Based True Random Number Generator", IEICE Transactions on Information and Systems, vol. E95.D, issue 2, pp. 426-436, Feb. 2012.

Kim et al., "Nano-Intrinsic True Random Number Generation", Published in ArXiv 2017, arXiv:1701.06020v1 [cs.ET], pp. 1-9, Jan. 21, 2017.

Kinniment et al., "Design of an On-Chip Random Number Generator using Metastability", Proceedings of the 28th European Solid-State Circuits Conference, pp. 1-4, Sep. 24-26, 2002.

Majzoobi et al., "FPGA-based True Random Number Generation using Circuit Metastability with Adaptive Feedback Control", International Workshop on Cryptographic Hardware and Embedded Systems—CHES 2011, pp. 17-32, year 2011.

Ranasinghe et al., "Random numbers from metastability and thermal noise", Electronics Letters, vol. 41 ,Issue 16, pp. 891-893, Aug. 4, 2005.

Ben Romdhane et al., "Modeling, design and characterization of delay-chains based true random number generator", Doctor Thesis, Micro and nanotechnologies/Microelectronics,Télécom ParisTech, pp. 1-181, year 2014.

Torii et al,, "ASIC implementation of random number generators using SR latches and its evaluation", EURASIP Journal on Information Security, pp. 1-12, year 2016.

Hershman et al., U.S. Appl. No. 16/194,342, filed Nov. 18, 2018.

Srinivasan et al., "2.4 GHz 7mW All-Digital PVT-Variation Tolerant True Random Number Generator in 45nm CMOS", Symposium on VLSI Circuits/Technical Digest of Technical Papers, pp. 203-204, Jul. 2010.

Ben-Romdhane et al., "Stochastic Model of a Metastability-Based True Random Number Generator", International Conference on Trust and Trustworthy Computing, pp. 92-105, year 2013.

Mathew et al., "2A Gbps, 7 mW All-Digital PVT-Variation Tolerant True Random Number Generator for 45 nm CMOS High-Performance Microprocessors", IEEE Journal of Solid-State Circuits, vol. 47, issue 11, pp. 2807-2821, Nov. 2012.

* cited by examiner

RANDOM NUMBER GENERATOR BASED ON META-STABILITY OF SHORTED BACK-TO-BACK INVERTERS

FIELD OF THE INVENTION

The present invention relates generally to random number generation, and particularly to methods and devices for random number generation based on shorted back-to-back inverters.

BACKGROUND OF THE INVENTION

Various circuits and techniques for random number generation are known in the art. Some random number generators (RNGs) are based on meta-stability, i.e., on setting an electronic component to a meta-stable state. For example, Barangi et al., describe meta-stability based RNGs in "Straintronics-Based True Random Number Generator for High-Speed and Energy-Limited Applications," IEEE Transactions on Magnetics, volume 52, issue 1, January, 2016.

Srinivasan et al. describe a RNG that uses two-step coarse/fine-grained tuning with a self-calibrating feedback loop, in "2.4 GHz 7 mW all-digital PVT-variation tolerant True Random Number Generator in 45 nm CMOS," 2010 IEEE Symposium on VLSI Circuits (VLSIC), July, 2010.

SUMMARY OF THE INVENTION

An embodiment of the present invention that is described herein provides an electronic circuit for Random Number Generation (RNG), including first and second inverters, a switch, and logic circuitry. The first inverter has a first input and a first output, and the second inverter has a second input and a second output. The first output is connected to the second input, and the second output is connected to the first input. The switch is configured to (i) when closed, to set the first and second inverters to a meta-stable state by shorting the first output to the first input and the second output to the second input, and (ii) when open, to release the first and second inverters from the meta-stable state to a bi-stable random state. The logic circuitry is configured to alternately close and open the switch, and to output random values from at least one of the first and second inverters when at the bi-stable random state.

In some embodiments, the logic circuitry is configured to alternately close and open the switch by applying a clock signal to the switch. In some embodiments, the logic circuitry is further configured to apply a noisy signal to the switch. In an embodiment, the logic circuitry is configured to increase a randomness of the output random values by accumulating a plurality of the output random values.

In a disclosed embodiment, the circuit further includes a functional Flip-Flop configured to receive a functional input signal and to output a functional output signal, and a multiplexer (MUX) configured to produce an output in which the random values are time-interleaved with values of the functional output signal.

In an embodiment, the switch and the first and second inverters form a RNG stage, the circuit includes at least one additional RNG stage including a respective switch and a respective pair of inverters, and the logic circuitry is configured to increase a randomness of the output random values by XORing respective outputs of the RNG stage and the additional RNG stage.

In an alternative embodiment, the switch and the first and second inverters form a RNG stage, the circuit includes at least one additional RNG stage including a respective switch and a respective pair of inverters, and the logic circuitry is configured to alternately close and open the switch of the RNG stage based on the output random values generated by the additional RNG stage.

In another embodiment, the switch and the first and second inverters form a RNG stage, the circuit includes at least one additional RNG stage including a respective switch and a respective pair of inverters, and the logic circuitry includes (i) an oscillator configured to generate a noise signal, and (ii) a chain of inverter or buffer stages, which is driven by the noise signal. Outputs of the inverter or buffer stages are applied as external noise to the RNG stage and to the at least one additional RNG stage.

In yet another embodiment, the switch and the first and second inverters form a RNG stage, the circuit includes at least one additional RNG stage including a respective switch and a respective pair of inverters, and the logic circuitry includes a chain of delay elements configured to generate replicas of a clock signal. Outputs of the delay elements are applied to the switches of the RNG stage and of the at least one additional RNG stage.

In some embodiments, the logic circuitry is configured to derive a self-jittering clock signal from at least one of the first and second outputs of the first and second inverters, and to alternately close and open the switch using the self-jittering clock signal. In an embodiment, the logic circuitry is configured to derive the self-jittering clock signal by (i) setting the self-jittering clock signal to a first logical value when at least one of the outputs of the first and second inverters is less than a predefined distance from a voltage representing the first logical value, and (ii) setting the self-jittering clock signal to a second logical value when the outputs of the first and second inverters are both more than the predefined distance from the voltage representing the first logical value.

There is additionally provided, in accordance with an embodiment of the present invention, a method for Random Number Generation (RNG) including operating a first inverter having a first input and a first output, and a second inverter having a second input and a second output, wherein the first output is connected to the second input, and the second output is connected to the first input. A switch is alternately closed and opened. When closed, the switch sets the first and second inverters to a meta-stable state by shorting the first output to the first input and the second output to the second input. When open, the switch releases the first and second inverters from the meta-stable state to a bi-stable random state. Random values are output from at least one of the first and second inverters when at the bi-stable random state.

The present invention will be more fully understood from the following detailed description of the embodiments thereof, taken together with the drawings in which:

DETAILED DESCRIPTION OF EMBODIMENTS

Overview

Figure 1:
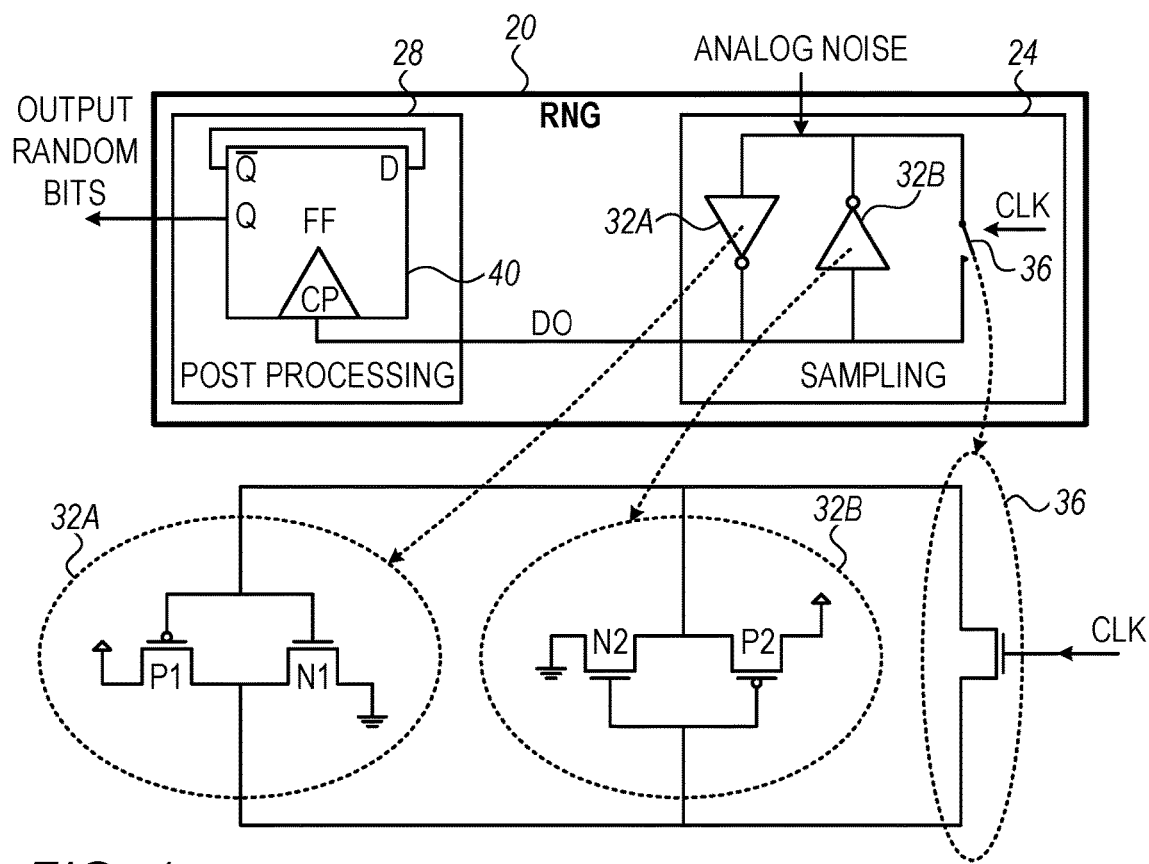
FIG. 1 is a block diagram that schematically illustrates a Random Number Generator (RNG), in accordance with an embodiment of the present invention.

Embodiments of the present invention that are described herein provide improved methods and circuits for random number generation. The disclosed Random Number Generators (RNGs) can be used, for example, in systems that perform cryptographic operations or in any other application that uses random numbers. The RNGs described herein are small, fast and scalable, and are therefore particularly attractive for low-cost, low current consumption systems that require a high rate of random numbers.

In some disclosed embodiments, a random number generation (RNG) circuit comprises a pair of inverters (NOT gates) that are connected back-to-back, i.e., the input of each inverter is fed by the output of the other inverter. A switch is connected across the pair of inverters. When the switch is closed, the inverters are put in a meta-stable state in which their outputs drift, or otherwise wander, within the voltage range that lies between the voltage representing logical "0" and the voltage representing logical "1". Opening the switch releases the inverters from the meta-stable state into a bi-stable state.

When entering the bi-stable state, the output of one inverter stabilizes at logical "1" and the output of the other inverter stabilizes at logical "0". The choice of which inverter will output logical "1" and which inverter will output logical "0", however, is random, and depends on the instantaneous analog voltages at the outputs of the inverters at the moment the switch was opened. Therefore, closing and re-opening the switch causes the pair of inverters to generate a random binary value. The output of either inverter can be used for extracting the random value.

In some embodiments, the RNG further comprises control logic that alternately closes and opens the switch, e.g., using a clock signal, and outputs the resulting sequence of random values from the inverters.

Various RNG configurations, which are based on the shorted back-to-back inverters building-block, are described herein. In some disclosed configurations the logic circuitry enhances randomness by accumulating multiple random values. Other disclosed configurations comprise a cascade of two or more pairs of inverters. In yet other embodiments, the outputs of the inverters are used for deriving a self-jittering alternating signal, which is in turn used for toggling the switch. This scheme has enhances randomness, since noise is introduced both by the meta-stability of the inverters and by the time jitter in the alternating signal that toggles the switch.

In some embodiments the RNG comprises calibration circuitry that calibrates the drive-strengths of the inverters in order to achieve better randomness. In many practical applications, however, such calibration is not required since the disclosed shorting scheme possesses an inherent self-calibration property that compensates for mismatch between the inverters.

The disclosed RNG schemes are simple to implement, yet provide a degree of randomness that is sufficient in many applications. Due to the circuit simplicity, the disclosed RNGs can operate at high rates, e.g., on the order of 100 Mbps or more.

RNG Using Intermittent Shorting of Back-to-Back Inverters

FIG. 1 is a block diagram that schematically illustrates a Random Number Generator (RNG) 20, in accordance with an embodiment of the present invention. RNG 20 receives as input analog noise, and uses this noise to generate a sequence of random bits as output. The noise may originate from any suitable source of noise, e.g., thermal noise across a resistor, cosmic or electromagnetic radiation, existing digital or analog circuit activity, or using a noise generator circuit such as a ring oscillator. The noise may be filtered by a suitable high-pass filter to reduce correlation between subsequent noise samples.

In the present example, RNG 20 comprises a sampling circuit 24 that generates random bits from the analog noise, and a post-processing circuit 28 that enhances the randomness of the random bits. In alternative embodiments post-processing circuit 28 may be omitted, in which case the output bits generated by sampling circuit 24 serve as the output of RNG 20.

Sampling circuit 24 comprises a pair of inverters (logical NOT gates) 32A and 32B. The two inverters are connected back-to-back, i.e., the output of inverter 32A feeds the input of inverter 32B, and the output of inverter 32B feeds the input of inverter 32A. The analog input noise can be applied to any selected point in this back-to-back connection. A switch 36 is connected across the back-to-back connected inverters. Switch 36 is driven by a clock signal denoted CLK.

In some embodiments, the analog noise is generated by suitable circuitry. In other embodiments, natural noise that is gathered from the environment, e.g., via electro-magnetic fields, cosmic radiation and/or capacitive-coupling to nearby signals, may be sufficient to generate the required analog noise.

In some embodiments, a logic element, e.g., a buffer or inverter, is placed at the output of the sampling circuit 24 (e.g., on the DO line, between the output of sampling circuit 24 and the input of post-processing circuit 28). This logic element is tuned to resolve the metastable state at its input when the switch 36 is closed into either logic "0" or logic "1" at its output. This can be implemented, for example, using an inverter with asymmetric NMOS and PMOS attributes.

The bottom of FIG. 1 depicts a more detailed circuit implementation of sampling circuit 24, in an embodiment. As seen, inverter 32A is implemented using a Positive Metal-Oxide Semiconductor Field-Effect Transistor (PMOS FET, or PMOS for brevity) P1 and an NMOS FET N1 (NMOS for brevity). The inverter input is applied to the gates of P1 and N1. The source pin of P1 is connected to the supply voltage VCC, the source pin of N1 is connected to ground. The drain pin of P1 is connected to the drain pin of N1, and this point is also used as the inverter output. Inverter 32B is implemented in a similar manner using a PMOS P2 and an NMOS N2. Switch 36 is implemented using a FET (NMOS in the present example, but may also comprise a PMOS) whose gate is driven by clock signal CLK and whose source and drain are connected across the pair of inverters.

In the present example, although not necessarily, switch 36 is closed when the clock signal is high, and is open when the clock signal is low. When switch 36 is closed, the inverters are short-circuited, i.e., the output of each inverter is shorted to its input (and to the input and output of the other inverter). At these times (clock-high intervals) inverters 32A and 32B are in a meta-stable state in which their outputs vary over the voltage range that lies between the voltage representing logical "0" and the voltage representing logical "1". On average, the voltage at the output of each inverter will be around the mid-point between the voltage representing logical "0" and the voltage representing logical "1", but the actual instantaneous voltage at a given point in time may vary in a random manner due to the analog noise.

Opening the switch (in the present example transitioning to clock-low) releases the inverters from the meta-stable state into a bi-stable state. When entering the bi-stable state, the output of inverter 32A converges to a bi-stable but random state (logical "1" or logical "0", depending on the momentary voltage values at the time the switch 36 was opened). The output of inverter 32B converges to the opposite state. The two inverters will retain these stable output states until switch 36 is closed again (in the present example on the next rising edge of clock signal CLK).

Thus, during each clock-low interval the output of each inverter provides a respective random binary value. In the present example, although not necessarily, the random binary values are taken from the output of inverter 32A.

Any suitable clock rate can be used for CLK. In one embodiment, the clock frequency is on the order of 200 MHz. The clock signal is not required to be accurate, and therefore simple clock generation circuitry (e.g., a ring oscillator) can be used for generating it.

The above-described scheme, of shorted back-to-back inverters, provides some built-in compensation for possible mismatch between the drive-strengths of the two inverters. Referring to the bottom of FIG. 1, when switch 36 is opened, the state to which inverters 32A and 32B will converge depends on a race between drive_strength(N1)+drive_strength(P2) and drive_strength(N2)+drive_strength(P1). Therefore, for example, a first order mismatch, in which drive_strength(N1)>drive_strength(N2) and drive_strength (P1)>drive_strength(P2) by the same ratio, will be compensated for.

As such, for many applications the achieved randomness is sufficient without a need for calibration. For example, computer simulations performed by the inventor show that randomness is high even in the presence of 5% mismatch in drive strength between inverters 32A and 32B, and/or 50% mismatch in drive strength between the PMOS transistor and NMOS transistor within each inverter. In the simulations, the nominal voltage level was assumed to be VDD=1.2V, and the injected noise level was ±25 mV. Nevertheless, when necessary, additional calibration circuitry may be added. See, for example, FIG. 7 below.

The sequence of random binary values DO (one per clock cycle) is provided to post-processing circuit 28. In the embodiment of FIG. 1, post-processing circuit 28 comprises a D Flip-Flop (D-FF) 40 having an input (D), an output (Q) and an inverted output ($\overline{Q}$). Inverted output $\overline{Q}$ is shorted to Input D. The random data values are applied to the clock input (CP) of the D-FF. The output Q of D-FF 40 is sampled at a lower rate than the sampling rate of DO, e.g., by a factor of ¼ or ¹⁄₁₆ or any other fraction. In this manner, D-FF 40 accumulates the random binary values and thus improves the randomness of the generated random sequence. Output Q serves as the output of circuit 28 (and of RNG 20 as a whole).

In some embodiments, the logic circuitry applies noise to clock signal CLK that drives switch 36 (e.g., applies noise to the gate of the FET used for implementing the switch). As a result, the noise from the gate may pass to the inverters through capacitive coupling (between the gate of switch 36 and its other pins). Additionally or alternatively, due to noise on the clock signal, the timing of closing and opening the switch is not perfectly periodic, but rather includes some time jitter. These effects help increase the level of randomness of the output random bits, and also makes the circuit less sensitive to data transitions in surrounding components.

Alternatively, other forms of applying noise to switch (not necessarily to the clock signal at the gate) can be used. In an example embodiment, a ring oscillator (comprising an odd number of inverter stages connected in a ring) is used for generating this noise. Each inverter stage in the ring oscillator can be electrically coupled (either through resistor, capacitor or other) to the nets connected to the inverters 32A, 32B or switch 36 and contributes to the overall noise, resulting is a very high noise level (on the order of the transition voltage of inverters 32A and 32B). Further alternatively, noise need not necessarily be applied to or via switch 36. Noise may be applied, as seen in the figure, for example, directly to the inverters. Noise may also arrive from power supply lines, from the substrate or from other sources.

In some embodiments, inverters 32A and 32B are high-threshold-voltage (HVT) inverters, so as to reduce leakage current while at the meta-stable state. In some embodiment, switch 36 comprises a strong low-threshold-voltage (LVT) NMOS, so as to increase switching speed.

Alternative Randomness Enhancement Schemes

Figure 2A:
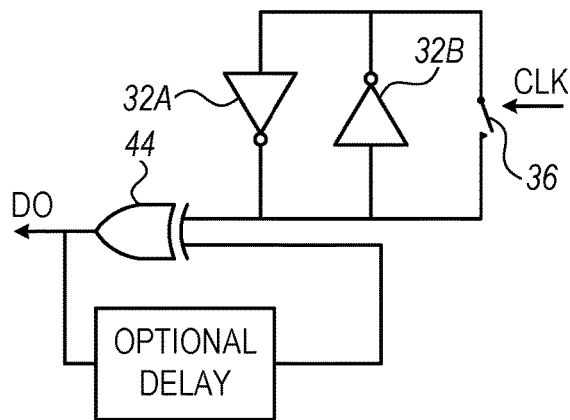
FIGS. 2A and 2B are block diagrams that schematically illustrate RNGs with post-processing, in accordance with embodiments of the present invention.
Figure 2B:
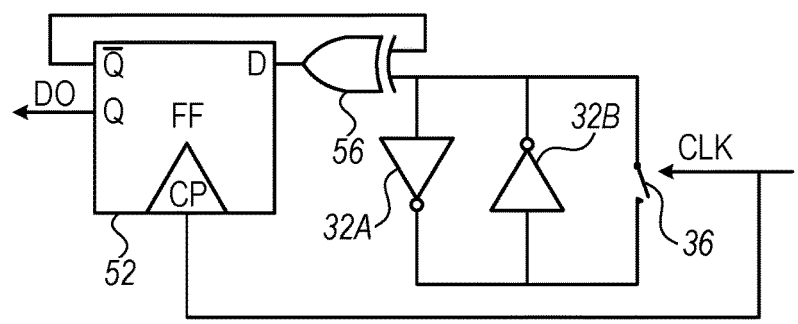

FIGS. 2A and 2B are block diagrams that schematically illustrate RNGs having alternative post-processing schemes, in accordance with alternative embodiments of the present invention. In FIG. 2A, post-processing is performed by a XOR gate 44 and an optional delay element 48. In FIG. 2B, post-processing is performed by a XOR gate 56 and a D-FF 52. FF 52 is clocked by the clock signal. XOR gate 56 is placed inside the feedback loop of FF 52.

Typically, switch 36 and the clock line delays are set so that FF 52 samples the bi-stable state of the output of inverter 32B XORed with the inverted previous output of FF 52. Note that XORing with the non-inverted previous output of FF 52, or performing a more sophisticated feedback scheme like Linear-feedback shift register (LFSR), is also applicable.

Both post-processing schemes are used for accumulating multiple random bit values in order to increase randomness—and can replace post-processing circuit 28 of FIG. 1.

In both schemes, to increase randomness, the output DO may be sampled at a lower rate than the rate of clock CLK.

Figure 3:
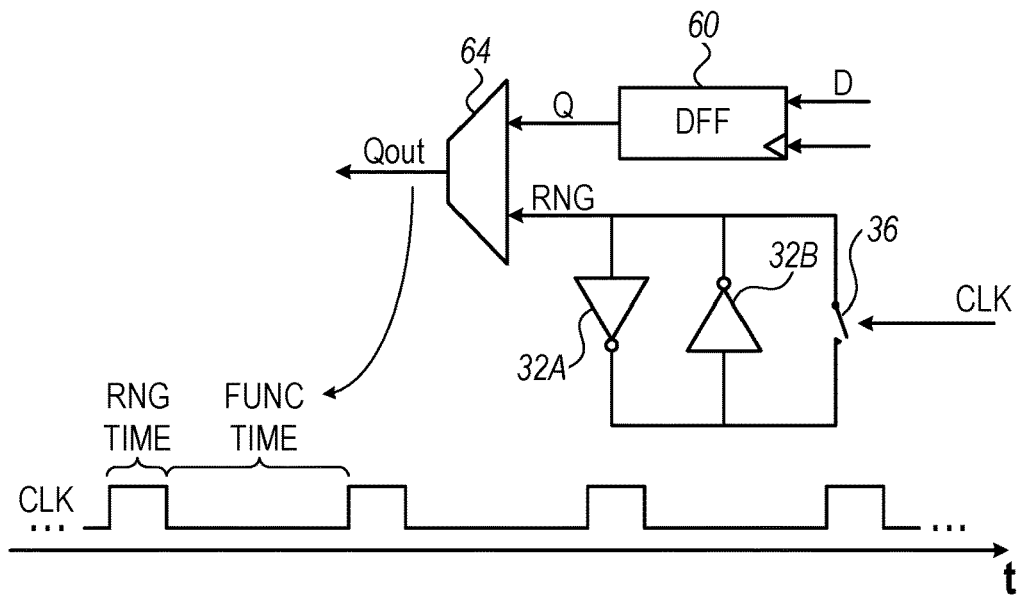
FIG. 3 is a block diagram that schematically illustrates a RNG integrated with a functional Flip-Flop (FF), in accordance with an embodiment of the present invention.

FIG. 3 is a block diagram that schematically illustrates an RNG integrated with a functional Flip-Flop (FF), in accordance with an embodiment of the present invention. In this implementation, the disclosed RNG scheme is integrated with a functional FF 60, and possibly shares some of the FF gates. The term "functional FF" means that the input (D) and output (Q) of this FF are functional signals of the host system. In addition to inverters 32A and 32B, switch 36 and FF 60, the circuit comprises a multiplexer (MUX) 64 that is clocked by clock signal CLK.

The output of the circuit (denoted Qout) is shown at the bottom of the figure as a function of time. As seen, each clock cycle comprises a respective "RNG time interval" followed by a respective "functional time interval." During the RNG time intervals, the value of Qout is random, since MUX 64 selects the RNG output. During the functional time intervals, the value of Qout is the output of functional FF 60, since MUX 64 selects the FF output. In other words, Qout comprises random values that are time-interleaved with values of the functional output signal.

The circuit of FIG. 3 is useful, for example, for mitigating side-channel attacks, e.g., Differential Power Analysis (DPA) attacks, on the host system. Additional aspects of mitigating attacks by multiplexing functional data and random data are addressed in U.S. patent application Ser. No. 16/194,342, filed Nov. 18, 2018, entitled "Mitigation of Side-Channel Attacks using Small-Overhead Random Pre-Charging," which is assigned to the assignee of the present patent application and whose disclosure is incorporated herein by reference.

Figure 4A:
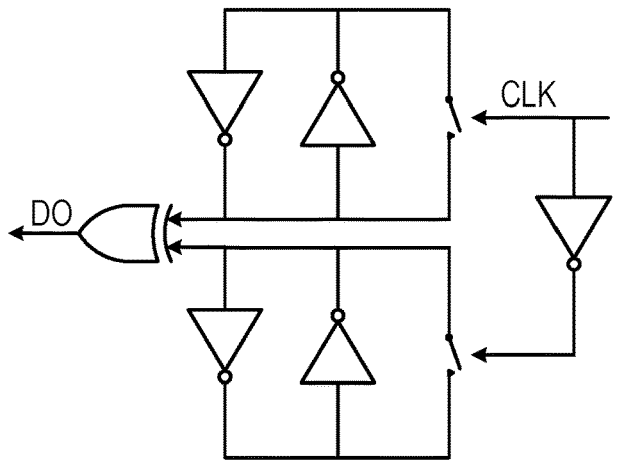
FIGS. 4A and 4B are block diagrams that schematically illustrate RNGs comprising parallel XORed RNG stages, in accordance with embodiments of the present invention.
Figure 4B:
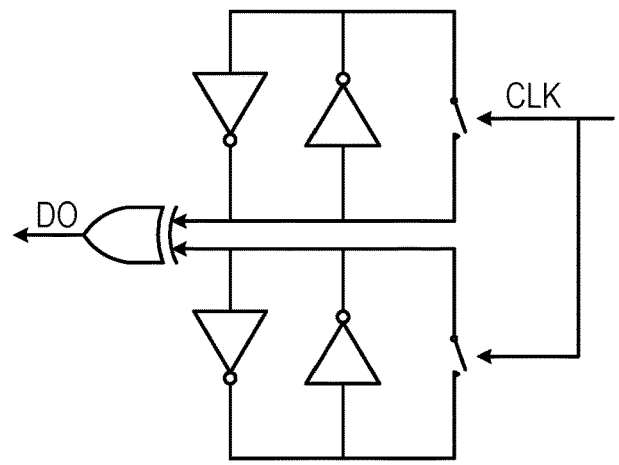

FIGS. 4A and 4B are block diagrams that schematically illustrate RNGs comprising parallel XORed RNG stages, in accordance with embodiments of the present invention. As seen in the figures, each individual RNG stage is similar to sampling circuit 24 of FIG. 1. A XOR gate performs a XOR between the outputs of the RNG stages, so as to produce the random output DO. In FIG. 4A, one RNG stage is clocked by CLK, and the other RNG stage is clocked by the negation of CLK. In FIG. 4B, both RNG stages are clocked by the same phase of clock signal CLK.

The parallel XORing schemes increase the level of randomness, relative to the randomness of a single RNG stage. The configurations of FIGS. 4A and 4B depict two RNG stages, by way of example. In alternative embodiments, any suitable number of RNG stages can be XORed in parallel. Further alternatively, any other suitable RNG stage configuration (e.g., the configuration of FIG. 2A or 2B) can be XORed. In comparison with the accumulation schemes of FIGS. 1, 2A and 2B, parallel XORing does not require down-sampling, but this benefit comes at the expense of hardware duplication.

Figure 5A:
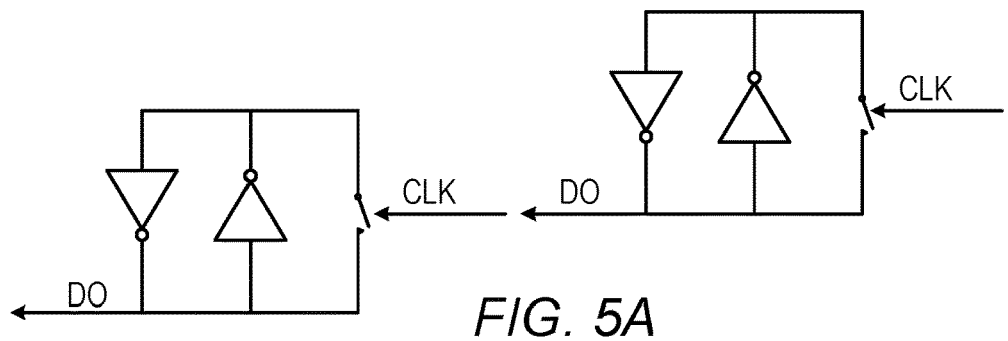
FIGS. 5A and 5B are block diagrams that schematically illustrate RNGs comprising cascaded RNG stages, in accordance with embodiments of the present invention.
Figure 5B:
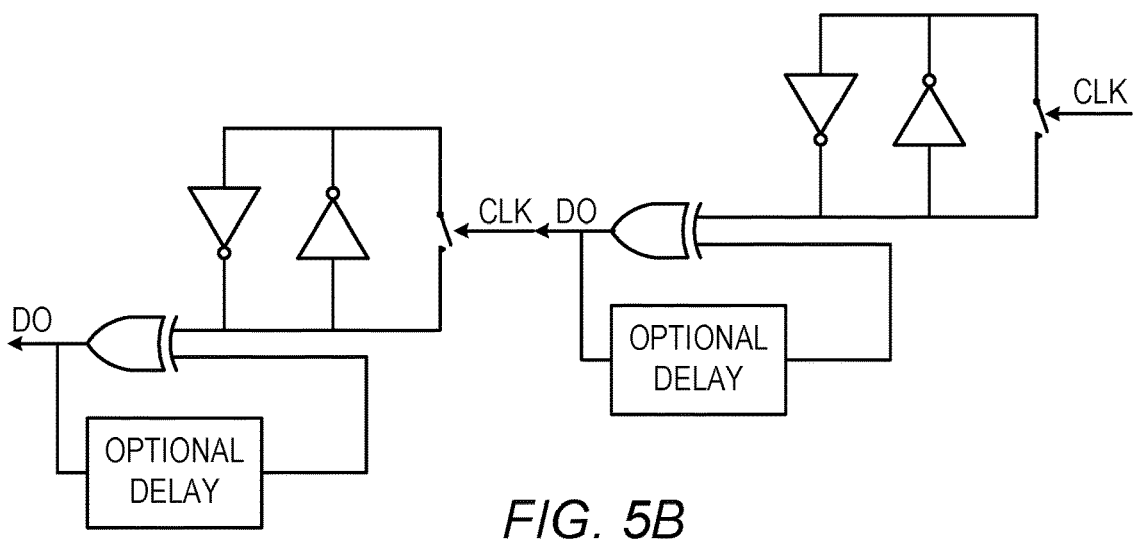

FIGS. 5A and 5B are block diagrams that schematically illustrate RNGs comprising cascaded RNG stages, in accordance with embodiments of the present invention. These schemes provide yet another way of enhancing the level of randomness, relative to the randomness of a single RNG stage.

In these cascaded schemes, the output (DO) of one RNG stage is used as the clock signal (CLK) of the next RNG stage in the cascade. In FIG. 5A, each individual RNG stage is similar to sampling circuit 24 of FIG. 1. In FIG. 5B, each individual RNG stage is similar to the RNG of FIG. 2A.

The configurations of FIGS. 5A and 5B depict two cascaded RNG stages, by way of example. In alternative embodiments, any suitable number of RNG stages can be cascaded. Further alternatively, any other suitable RNG stage configuration (e.g., the configuration of FIG. 2B) can be cascaded. In cascaded schemes, too, hardware is duplicated. On the other hand, randomness is improved without down-sampling, i.e., while retaining the original clock rate.

Figure 6:
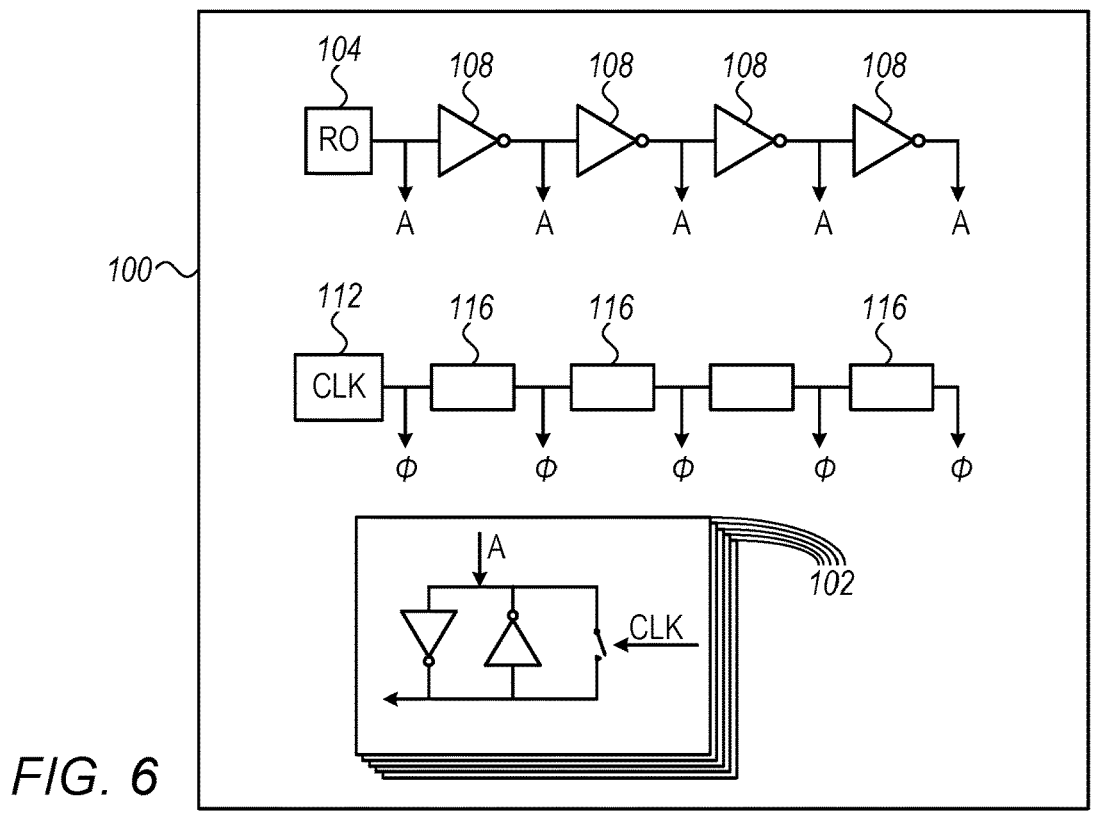
FIG. 6 is a block diagram that schematically illustrates a RNG with enhanced randomness, in accordance with an embodiment of the present invention.

FIG. 6 is a block diagram that schematically illustrates a RNG 100 with enhanced randomness, in accordance with another embodiment of the present invention. This configuration is yet another technique for increasing the level of randomness of the RNG output.

In the present example, RNG 100 comprises a plurality of RNG stages 102. Any suitable number of RNG stages 102 can be used. Each RNG stage 102 comprises a pair of back-to-back inverters and a switch, as explained above. The RNG stages may be connected in any suitable way to produce the output of RNG 100, e.g., by XORing (as, for example, in FIG. 4A or 4B) or by connecting each RNG stage 102 to a post-processing unit 28. Each RNG stage 102 has a clock input CLK that clock the respective switch, an "A" input for receiving external noise, and a "DO" output for outputting random bits.

RNG 100 further comprises a Ring Oscillator (RO) 104 that drives a chain of inverters 108. The "A" input of each RNG stage 102 is coupled, e.g., via capacitive coupling, to a selected tap of the inverter chain. Thus, each RNG stage 102 receives a delayed and/or inverted replica of the RO signal that serves as external noise. In alternative embodiments, RNG 100 comprises multiple ROs 104, typically having different frequencies, each RO driving a respective chain of inverters 108. Alternatively to inverters, buffers can also be used.

RNG 100 also comprises a clock source 112 that drives a chain of delay elements 116. Each tap of the chain produces a certain clock phase (denoted $\phi$). The "CLK" input of each RNG stage 102 is connected to a selected tap of the chain of delay elements, i.e., is clocked by a selected clock phase.

By driving the clock and external-noise inputs of the various RNG stages with different noise and clock signal replicas, the level of randomness of the overall RNG output is enhanced. In some embodiments, only one of "CLK" and "RO" comprises multiple taps. In some embodiments, CLK is asynchronous to RO. In some embodiments, when more than one RO is implemented, their frequencies are asynchronous. In some embodiments, at least one of RO and CLK are implemented with intentional jitter, e.g., a digital jitter by taking the clock from the output of an LFSR.

Optional Drive-Strength Calibration

Figure 7:
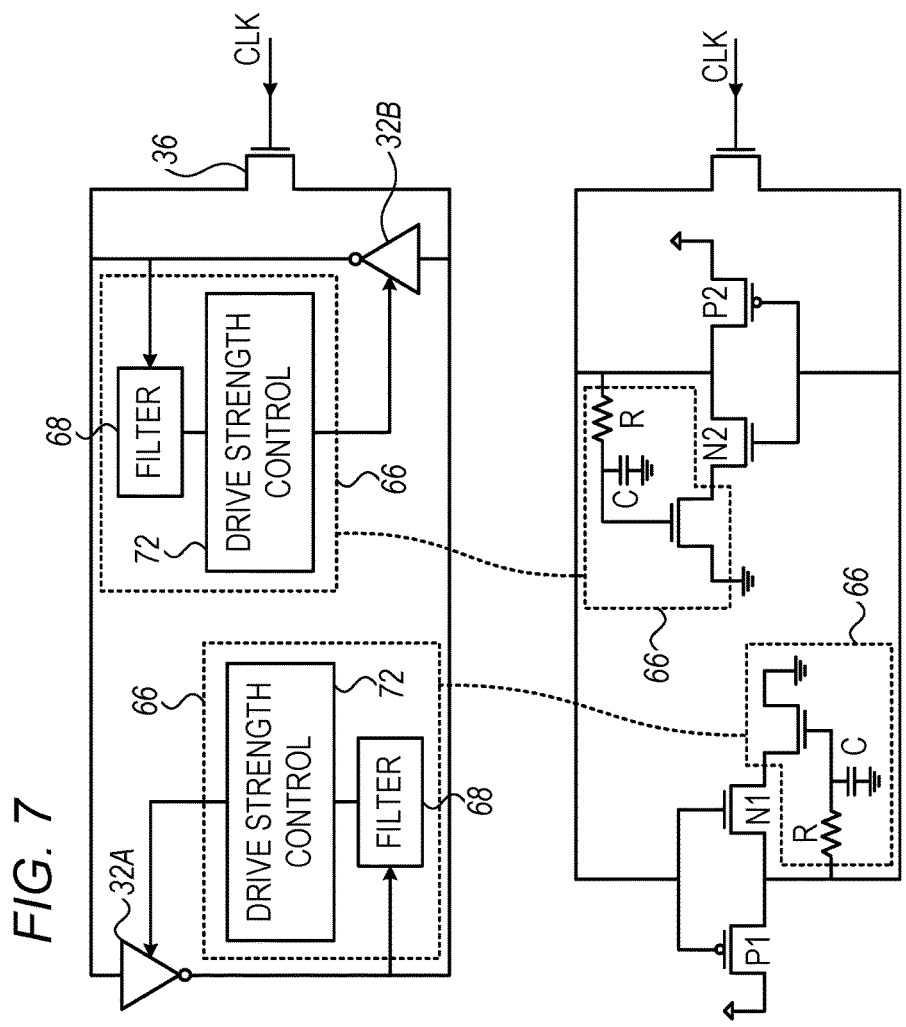
FIG. 7 is a block diagram that schematically illustrates a RNG with drive-strength calibration, in accordance with an embodiment of the present invention.

FIG. 7 is a block diagram that schematically illustrates a RNG with drive-strength calibration, in accordance with an embodiment of the present invention. In this example, the RNG comprises back-to-back shorted inverters 32A and 32B, as explained above. In addition, the RNG comprises a pair of drive-strength calibration circuits 66 coupled respectively to the inverters.

Each drive-strength calibration circuit 66 comprises a filter 68 and a control circuit 72. Filter 68 low-pass filters the voltage at the output of the inverter. Based on the filtered output voltage, control circuit 72 adjusts the drive-strength of the inverter. The two drive-strength calibration circuits 66 operate independently of one another.

An example implementation of drive-strength calibration circuits 66 is shown at the bottom of the figure. In this example, each filter 68 comprises a resistor-capacitor (RC) filter, and each control circuit 72 comprises a transistor that adjusts the bias of the NMOS of the respective inverter, so that if for example, at a certain time, the average output of 'P1 N1' inverter is lowered due to imbalanced RNG samples, the voltage on the coupled capacitor C will drop, causing larger resistance between N1 source pin to ground, thereby weakens its ability to drive '0' and as a result, cause the average voltage on 'P1 N1' inverter to rise and vice versa. Analogously, the same process happens on 'P2 N2' process.

In the example of FIG. 7, both inverters 32A and 32B are calibrated. In another embodiment, only one of the inverters is calibrated, in which case one of circuits 66 is omitted.

Figure 8:
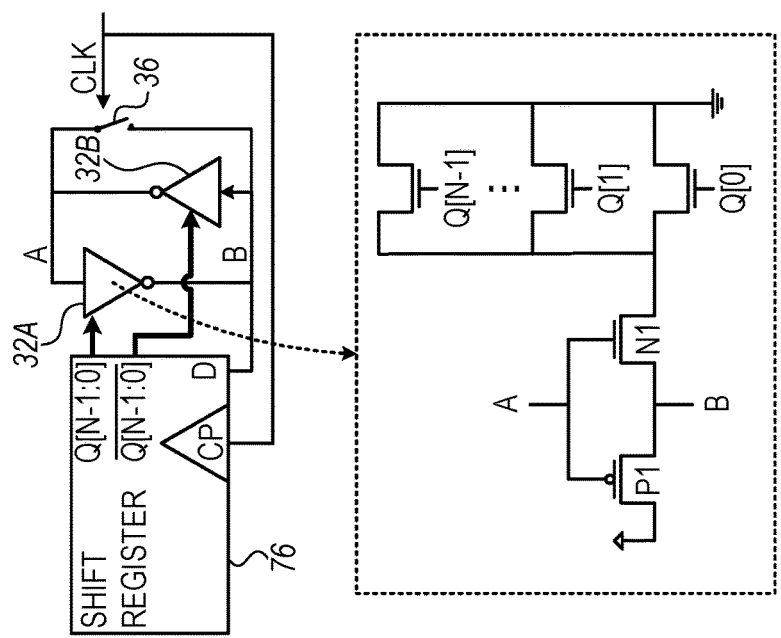
FIG. 8 is a block diagram that schematically illustrates a RNG with drive-strength calibration using a shift register, in accordance with an embodiment of the present invention.

FIG. 8 is a block diagram that schematically illustrates a RNG with drive-strength calibration using a shift register 76, in accordance with another embodiment of the present invention. In this alternative calibration scheme, shift register 76 holds a digital word denoted Q[N-1:0], which specifies a calibration value to be applied to the NMOS transistors of inverters 32A and 32B, respectively. A stack of N transistors, connected in parallel to one another is coupled to the NMOS of each inverter, as shown at the bottom of the figure. The gate of each transistor is driven by a respective bit of the control word of that inverter. One inverter is calibrated with the value of the control word, and the other inverter is calibrated with the inverse of this value. In the example of FIG. 8, both inverters 32A and 32B are calibrated. In another embodiment, only one of the inverters is calibrated.

When carrying out drive-strength calibration, e.g., using the scheme of FIG. 7 or FIG. 8, the drive-strength control may be tuned per process.

RNG with Self-Jittering Clock Signal

Figure 9:
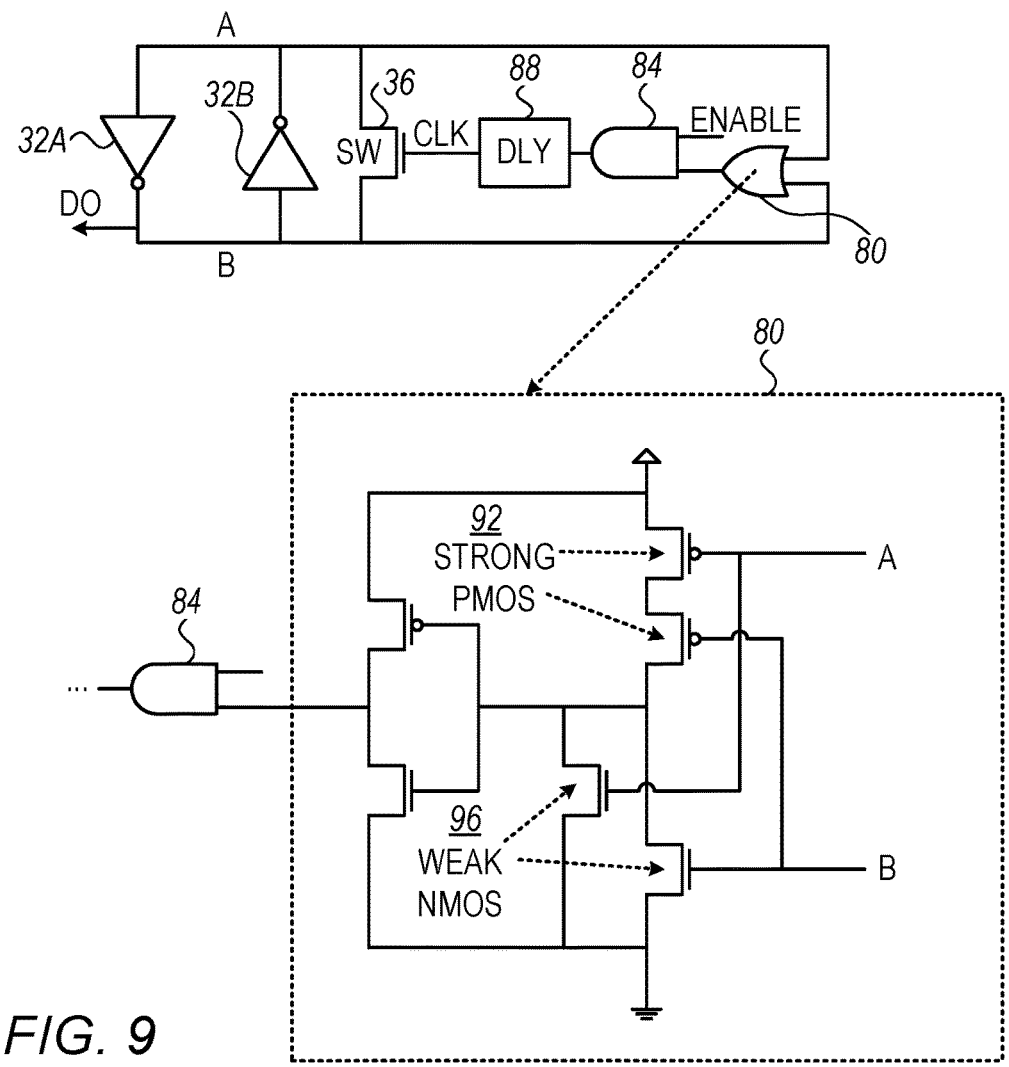
FIGS. 9 and 10 are block diagrams that schematically illustrate RNGs with self-jittering clock signals, in accordance with embodiments of the present invention.

FIG. 9 is a block diagram that schematically illustrates a RNG with self-jittering clock signal, in accordance with an embodiment of the present invention. In this embodiment, the alternating signal (CLK), which toggles switch 36, is derived internally in the RNG from the outputs of the two inverters, in a manner that introduces random jitter into the signal transition times.

The self-jittering clock signal helps to improve the randomness of the output bits DO, when sampled with some system clock, possibly after some post-processing. The randomness improvement is even larger if this system clock has a considerably lower rate than CLK. The randomness improvement gained by the self-jittering clock signal comes in addition to the randomness of the shorted back-to-back inverters described at length above.

The RNG of FIG. 9 comprises back-to-back inverters 32A and 32B, and switch 36, as in the embodiments above. In the present embodiment, the voltages at points "A" and "B" (the instantaneous output voltages of the two inverters) are fed back into respective inputs of an OR gate 80.

The output of OR gate 80 is provided one input of an AND gate 84, whose other input is driven by an ENABLE signal. AND gate 84 is optional, and is used for selectively enabling and disabling the RNG. The description that follows assumes the ENABLE signal is "1", and therefore the output of OR gate 80 is reflected as-is to the output of AND gate 84. The output of AND gate 84 is delayed by a delay element 88. The output of delay element 88 is the CLK signal that is provided to switch 36. Delay element 88 is also optional and may be omitted in some embodiments.

The above-described circuit generates an alternating CLK signal that toggles switch 36. As noted above, outputs "A" and "B" of the inverters are fed back to the inputs of OR gate 80. Unlike a conventional OR gate, however, OR gate 80 interprets its inputs as logical "1" only when their voltages are close to the voltage that represents logical "1". Otherwise, i.e., across most of the voltage range between the voltages representing "1" and "0", OR gate 80 interprets its inputs as logical "0". In particular, when inverters 32A and 32B are in the meta-stable state, both "A" and "B" inputs to OR gate 80 are interpreted as logic '0'.

For example, consider a case in which logical "0" is represented by a voltage of 0V, and logical "1" is represented by a voltage of 1.2V. Unlike a conventional OR gate, in which any voltage below 0.6V is regarded as "0" and any voltage above 0.6V is regarded as "1", OR gate 80 regards a certain input as "1" if its voltage is above 1V, and "0" otherwise. Alternatively, other suitable thresholds can be used. Typically, the threshold being used is much closer to the voltage representing "1" than the mid-point between the voltage representing "1" and the voltage representing "0".

When switch 36 opens (CLK goes from logical "1" to logical "0"), the voltages at one of points "A" and "B" transitions from some arbitrary voltage to the voltage representing "1", and the voltage at the other point transitions from some arbitrary voltage to the voltage representing "0". The duration of these transitions is random, depending on the actual voltages at "A" and "B" at the time switch 36 is opened.

Since OR gate 80 interprets inputs "A" and "B" as logical "1" only when they approach the voltage representing "1" (not when they cross the mid-point between "0" and "1"), the time interval from the opening of switch 36 until the output of gate 80 is "1" is random. At this point, after the additional (optional) delays of AND gate 84 and delay element 88, the CLK signal becomes "1" and switch 36 is thus closed.

When switch 36 closes, the voltages at points "A" and "B" (outputs of the two inverters) become meta-stable. OR gate 80 interprets these voltages as "0", and therefore outputs "0". After the additional (optional) delays of AND gate 84 and delay element 88, the CLK signal becomes "0" and switch 36 opens. This process continues, and, as can be seen from the above description, switch 36 is toggled at a rate that has some random timing jitter.

Typically, OR gate 80 is designed such that when switch 36 is closed (inverters 32A and 32B are shorted), both inputs of the OR gate (the intermittent meta-stable outputs of the inverters) are interpreted reliably as "0" and thus the output of the OR gate is stable at "0". The OR gate is typically implemented such that these intermittent values do not cause excessive leakage current. As explained below, the delay of DLY 88 may be designed to have different rise-time and fall-time delays. In particular, the delay may be designed such that points "A" and "B" reach meta-stable state after switch 36 is closed.

The bottom of FIG. 9 shows an example implementation of OR gate 80, which meets the above requirements, in accordance with an embodiment of the present invention. In this example, the OR gate is implemented using a pair of "strong" PMOS transistors 92 and a pair of "weak" NMOS transistors 96. In the present context, the term "weak transistor" means that a large gate voltage is required in order to cause the transistor to conduct (i.e., in order for the input to be interpreted as "1"), and vice versa.

A "weak" NMOS may comprise, for example, a high-threshold-voltage (HVT) transistor having large channel length L and/or small channel width W. By the same token, a "strong" PMOS may comprise, for example, a low-threshold-voltage (LVT) transistor having small channel length L and/or large channel width W. Additionally or alternatively, an additional serial component (e.g., resistor, transistor, diode or otherwise) can be inserted between the source of each NMOS 96 device and ground. This implementation further weakens the recognition of logical "1" by the NMOS 96 devices. This configuration causes the output of gate 80 to become "1" only when both inputs "A" and "B" are close to the voltage representing "1".

In the example of FIG. 9, the alternating CLK signal is derived from the voltages at points "A" and "B" using a non-conventional OR gate, as explained above. In an alternative embodiment, the OR gate can be replaced with a NAND gate having comparable properties.

The delay of the feedback path (from points "A" and "B", via gate 80, gate 84 if used, delay element 88 if used, up to the gate of switch 36) should typically be large enough to allow the voltages at points "A" and "B" to stabilize, on opening and on closing of switch 36. In some embodiments, a different delay is applied on closing switch 36 (CLK going from "0" to "1") and on opening switch (CLK going from "1" to "0"). Such an asymmetric delay is useful for allowing stabilization on closing and on opening of the switch, without compromising cycle time (bit rate).

Figure 10:
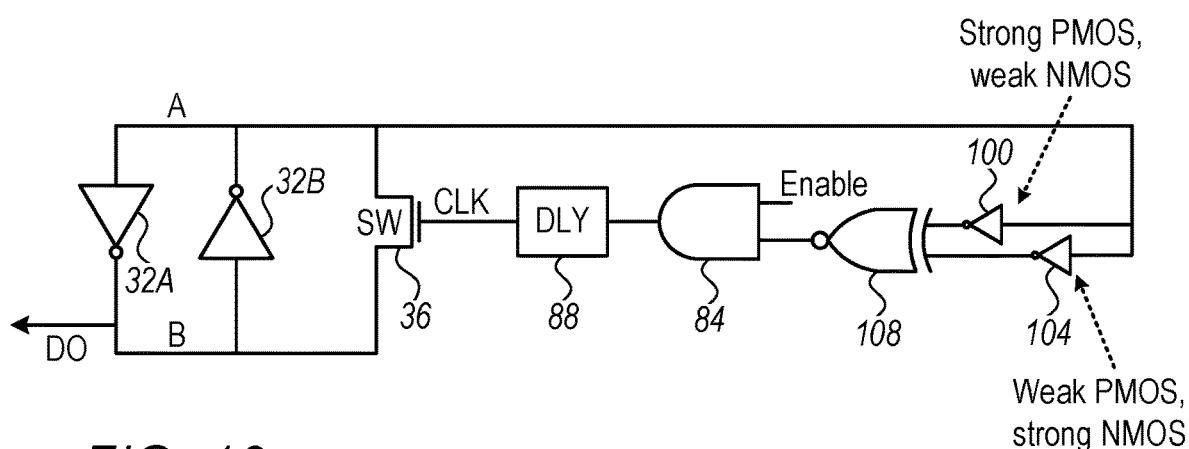

FIG. 10 is a block diagram that schematically illustrates another RNG with self-jittering clock signal, in accordance with an alternative embodiment of the present invention. Some of the RNG elements, namely inverters 32A and 32B, switch 36, delay 88 and AND gate 84, are similar to those of the RNG of FIG. 9. In the present embodiment, however, instead of OR gate 80 of FIG. 9, the RNG comprises two inverters 100 and 104 and a XNOR gate 108 (exclusive NOR, or equivalently XOR+NOT). The inputs to inverters 100 and 104 are both taken from point "A". (Alternatively, both inputs can be taken from point "B".)

In the embodiment of FIG. 10, inverter 100 is implemented using a strong PMOS and a weak NMOS. Inverter 104, on the other hand, is implemented using a weak PMOS and a strong NMOS. When inverters 32A and 32B are in the bi-stable state, the outputs of inverters 100 and 104 (i.e., the inputs of XNOR gate 108) will be at the same logic state (either both "1" or both "0"). As a result, the output of XNOR gate 108 will be "1". When inverters 32A and 32B are in the meta-stable state, the outputs of inverters 100 and 104 (i.e., the inputs of XNOR gate 108) will be at opposite logic state (one at "1" and the other at "0"). As a result, the output of XNOR gate 108 will be "0".

As can be seen from the description above, the operation of inverters 100 and 104 and XNOR gate 108 is logically equivalent to that of OR gate 80 of FIG. 9. The difference is that in FIG. 10, the output of only one of inverters 32A and 32B (i.e., only point "A" or only point "B") is used for generating the self-jittering clock.

Further alternatively, any other suitable circuit, which generates a self-jittering alternating CLK signal from the outputs of inverter 32A and/or inverter 32B, can be used.

Additional Embodiments and Variations

The RNG configurations shown in FIGS. 1, 2A, 2B, 3, 4A, 4B, 5A, 5B and 6-10 are example configurations that are depicted purely for the sake of conceptual clarity. In alternative embodiments, any other suitable configurations can be used. In any of these figures, and in alternative embodiment, circuit elements other than inverters 32A and 32B and switch 36 are referred to herein collectively as "logic circuitry." Among other possible functions, the logic circuitry is configured to alternately close and open the switch (e.g., using a clock signal), and to output random values from the inverters. In some embodiments, as in FIGS. 9 and 10, for example, the logic circuitry generates the alternating signal used for toggling the switch. Other functions of the logic circuitry may comprise various kinds of post-processing, e.g., for enhancing randomness.

In various embodiments, any of the disclosed RNGs may be implemented using any suitable hardware, such as using one or more discrete components, one or more Application-Specific Integrated Circuits (ASICs) and/or one or more Field-Programmable Gate Arrays (FPGAs).

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic circuit for Random Number Generation (RNG), comprising:
    a first inverter having a first input and a first output, and a second inverter having a second input and a second output, wherein the first output is connected to the second input, and the second output is connected to the first input;
    a switch, configured to receive an alternating signal, to alternately open and close in response to the alternating signal, and (i) when closed, to set the first and second inverters to a meta-stable state by shorting the first output to the first input and the second output to the second input, and (ii) when open, to release the first and second inverters from the meta-stable state to a bi-stable random state; and
    an output for outputting random values from at least one of the first and second inverters when at the bi-stable random state.

2. The circuit according to claim 1, wherein the alternating signal comprises a clock signal.

3. The circuit according to claim 1, and comprising circuitry configured to apply a noisy signal to the switch.

4. The circuit according to claim 1, and comprising logic circuitry configured to increase a randomness of the output random values by accumulating a plurality of the output random values.

5. The circuit according to claim 1, and comprising:
    a functional Flip-Flop configured to receive a functional input signal and to output a functional output signal; and
    a multiplexer (MUX) configured to produce an output signal in which the random values are time-interleaved with values of the functional output signal.

6. The circuit according to claim 1, wherein the switch and the first and second inverters form a RNG stage, and comprising at least one additional RNG stage comprising a respective switch and a respective pair of inverters, and further comprising logic circuitry configured to increase a randomness of the output random values by XORing respective outputs of the RNG stage and the at least one additional RNG stage.

7. The circuit according to claim 1, wherein the switch and the first and second inverters form a RNG stage, and comprising at least one additional RNG stage comprising a respective switch and a respective pair of inverters, wherein the switch of the RNG stage is configured to alternately close and open based on the output random values generated by the at least one additional RNG stage.

8. The circuit according to claim 1, wherein the switch and the first and second inverters form a RNG stage, and comprising at least one additional RNG stage comprising a respective switch and a respective pair of inverters, and further comprising:
an oscillator configured to generate a noise signal; and
a chain of inverter or buffer stages, which is driven by the noise signal, wherein outputs of the inverter or buffer stages are applied as external noise to the RNG stage and to the at least one additional RNG stage.

9. The circuit according to claim 1, wherein the switch and the first and second inverters form a RNG stage, and comprising at least one additional RNG stage comprising a respective switch and a respective pair of inverters, and further comprising a chain of delay elements configured to generate replicas of a clock signal, wherein outputs of the delay elements are applied to the switches of the RNG stage and of the at least one additional RNG stage.

10. The circuit according to claim 1, and comprising logic circuitry configured to derive a self-jittering clock signal from at least one of the first and second outputs of the first and second inverters, and to alternately close and open the switch using the self-jittering clock signal.

11. The circuit according to claim 10, wherein the logic circuitry is configured to derive the self-jittering clock signal by:
setting the self-jittering clock signal to a first logical value when at least one of the outputs of the first and second inverters is less than a predefined distance from a voltage representing the first logical value; and
setting the self-jittering clock signal to a second logical value when the outputs of the first and second inverters are both more than the predefined distance from the voltage representing the first logical value.

12. A method for Random Number Generation (RNG), comprising:
operating a first inverter having a first input and a first output, and a second inverter having a second input and a second output, wherein the first output is connected to the second input, and the second output is connected to the first input;
alternately closing and opening a switch that (i) when closed, sets the first and second inverters to a meta-stable state by shorting the first output to the first input and the second output to the second input, and (ii) when open, releases the first and second inverters from the meta-stable state to a bi-stable random state; and
outputting random values from at least one of the first and second inverters when at the bi-stable random state.

13. The method according to claim 12, wherein alternately closing and opening the switch comprises applying a clock signal to the switch.

14. The method according to claim 12, further comprising applying a noisy signal to the switch.

15. The method according to claim 12, further comprising increasing a randomness of the output random values by accumulating a plurality of the output random values.

16. The method according to claim 12, and comprising:
using a functional Flip-Flop, receiving a functional input signal and outputting a functional output signal; and
using a multiplexer (MUX), producing an output in which the random values are time-interleaved with values of the functional output signal.

17. The method according to claim 12, wherein the switch and the first and second inverters form a RNG stage, and comprising increasing a randomness of the output random values by XORing respective outputs of the RNG stage and at least one additional RNG stage comprising a respective switch and a respective pair of inverters.

18. The method according to claim 12, wherein the switch and the first and second inverters form a RNG stage, and wherein alternately closing and opening the switch of the RNG stage comprises controlling the switch based on the output random values generated by at least one additional RNG stage comprising a respective switch and a respective pair of inverters.

19. The method according to claim 12, wherein the switch and the first and second inverters form a RNG stage, and comprising generating a noise signal, and driving a chain of inverter or buffer stages with the noise signal, and applying outputs of the inverter or buffer stages as external noise to the RNG stage and to at least one additional RNG stage comprising a respective switch and a respective pair of inverters.

20. The method according to claim 12, wherein the switch and the first and second inverters form a RNG stage, and comprising generating replicas of a clock signal using a chain of delay elements, and applying outputs of the delay elements to switches of the RNG stage and of at least one additional RNG stage comprising a respective switch and a respective pair of inverters.

21. The method according to claim 12, wherein alternately closing and opening the switch comprises deriving a self-jittering clock signal from at least one of the first and second outputs of the first and second inverters, and alternately closing and opening the switch using the self-jittering clock signal.

22. The method according to claim 21, wherein deriving the self-jittering clock signal comprises:
setting the self-jittering clock signal to a first logical value when at least one of the outputs of the first and second inverters is less than a predefined distance from a voltage representing the first logical value; and
setting the self-jittering clock signal to a second logical value when the outputs of the first and second inverters are both more than the predefined distance from the voltage representing the first logical value.

* * * * *